US005805462A

United States Patent [19]
Poirot et al.

[11] Patent Number: 5,805,462
[45] Date of Patent: Sep. 8, 1998

[54] AUTOMATIC SYNTHESIS OF INTEGRATED CIRCUITS EMPLOYING BOOLEAN DECOMPOSITION

[75] Inventors: Frank Poirot, Antibes, France; Ramine Roane, Sunnyvale, Calif.; Gerard Tarroux, Villeneuve Loubet, France

[73] Assignee: VLSI Technology, Inc., San Jose, Calif.

[21] Appl. No.: 516,847

[22] Filed: Aug. 18, 1995

[51] Int. Cl.$^6$ .............................. G06F 17/50; G06F 17/10
[52] U.S. Cl. ......................... 364/490; 364/488; 364/489; 364/491; 364/578
[58] Field of Search .................................... 364/488, 489, 364/490, 491, 578

[56] References Cited

U.S. PATENT DOCUMENTS

| 5,434,794 | 7/1995 | Coudert et al. | 364/489 |
| 5,487,017 | 1/1996 | Prasad et al. | 364/488 |

OTHER PUBLICATIONS

O. Coudert and J.C. Madre, "Implicit and Incremental Computation of Primes and Essential Primes of Boolean Functions", 1992, pp. 36–39, 29th ACM/IEEE Design Automation Conference, 8 Jun. 1992.

Oliver Coudert, Jean Christophe Madre and Henri Fraisse, "A New Viewpoint on Two–Level Logic Minimization", 1993, pp. 625–630, 30th ACM/IEEE Design Automation Conference, 14–18 Jun. 1993.

Ted Stanion and Carl Sechen, "Boolean Divison and Factorization Using Binary Decision Diagrams", pp. 1179–1184, IEEE Transactions on Computer–Aided Design of Integrated Circuits and Systems, vol. 13, No. 9, Sep. 1994.

Shin–ichi Minato, "Zero–Supporessed BDDs for Set Manipulation in Combinatorial Problems" NTT LSI Laboratories, pp. 1–6., 14–18 Jun. 1993.

Robert K. Brayton, Richard Rudell, Alberto Sangiovanni–Vincentelli and Albert R. Wang, "MIS: A Multiple–Level Logic Optimization System", pp. 1062–1081, IEEE Transactions on Computer–Aided Design, vol. Cad–6, No. 6, Nov. 1987.

Randal E. Bryant, "Graph–Based Algorithm for Boolean Function Manipulation", pp. 677–691, IEEE Transactions on Computers, vol. C–35, No. 8. Aug., 1986.

Stanion et al. ("Boolean Division and Factorization Using Binary Decision Diagram", IEEE Transactions on Computer–Aided design of Integrated Circuits and Systems, vol. 13, No. 9, pp. 1179–1184), Sep. 1994.

Radivojevic et al. ("On Applicability of Symbolic Techniques to Larger Scheduling Problems", IEEE Proceedings of the European Design and Test Conference, pp. 1062–1081), Mar. 9, 1995.

Brayton et al. ("MIS: A Multiple–Level Logic Optimization System", IEEE Transactions on Computer–Aided Design, vol. CAD–6, pp. 48–53), Nov. 1987.

(List continued on next page.)

*Primary Examiner*—Jacques Louis-Jacques
*Assistant Examiner*—Phallaka Kik
*Attorney, Agent, or Firm*—Burns, Doane, Swecker & Mathis LLP

[57] ABSTRACT

A method of automatic synthesis of an integrated circuit, comprising the steps, performed by a programmed machine, of storing a Boolean expression which expresses a combinatorial part of the said integrated circuit, factorizing the Boolean expression and mapping the factorized Boolean expression into a representation of said integrated circuit in hardware terms. The step of factorizing comprises computing a zero-suppressed binary decision diagram unique to and representing the Boolean expression; computing, from said ZBDD, candidate divisors of said expression; selecting candidate divisors; and dividing the Boolean expression by the candidate divisor. The selection of candidate divisors includes computing attributed value on the basis of the saving of literals. The method includes the use of implicit division comprising computing upper and lower bounds for a remainder and then a quotient.

10 Claims, 4 Drawing Sheets

OTHER PUBLICATIONS

Minato ("Zero–Suppressed BDDs for Set Manipulation in Combinatorial Problems", 30th ACM/IEEE Design Automation Conference, pp. 272–277), Jun. 14, 1993.

Hachtel et al. ("MUSE: A Multilevel Symbolic Encoding Algorithm for State Assignment", IEEE Transactions on Computer Aided Design, vol. 10, No. 1, pp. 28–38), Jan. 1991.

Malik et al. ("Logic Verification using Binary Decision Diagrams in a Logic Synthesis Environment", IEEE International Conference on Computer–Aided Design, ICCAD–88, pp. 6–9), Nov. 1988.

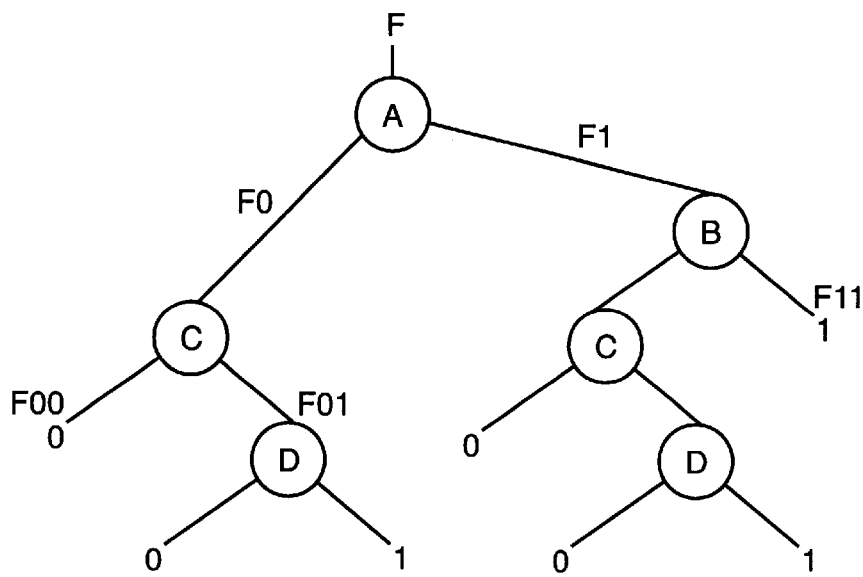
FIG._1
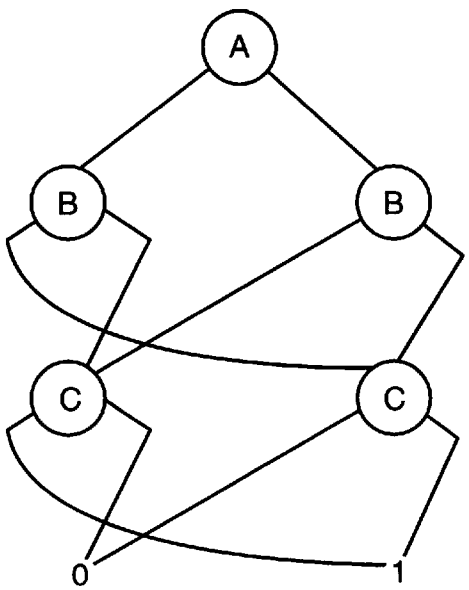
FIG._2
FIG._3

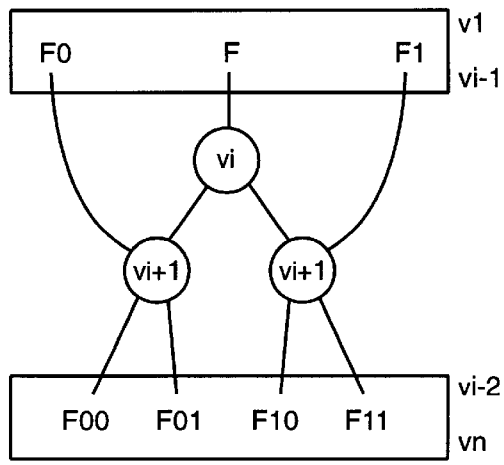
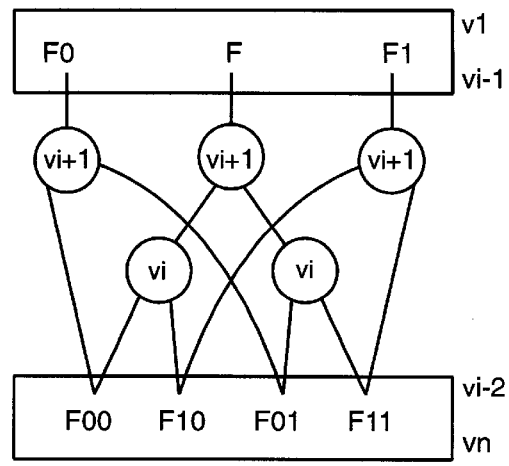
*FIG._4A*  *FIG._4B*
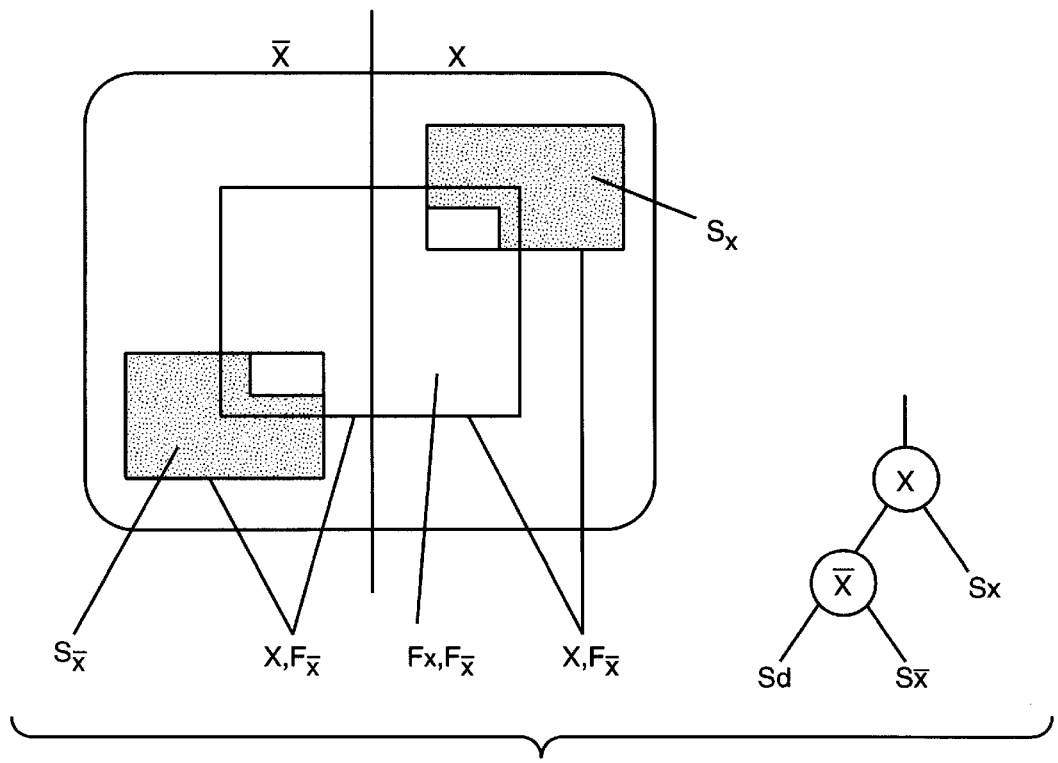
*FIG._5*

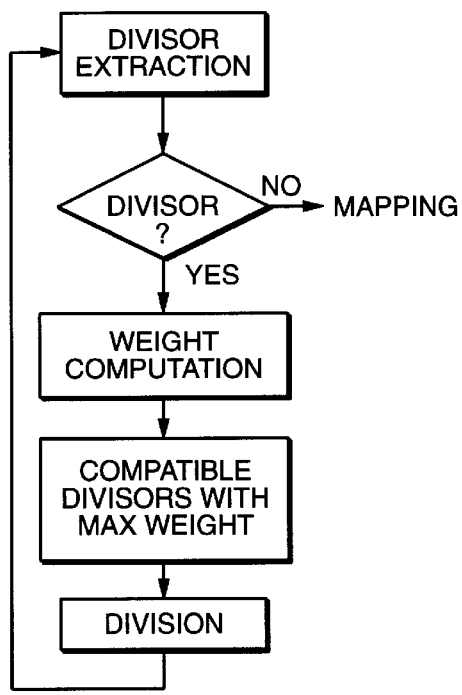
FIG._6
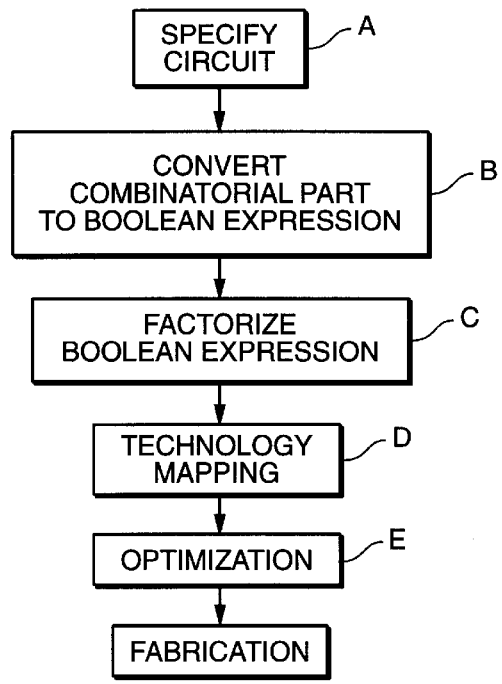
FIG._9
(PRIOR ART)
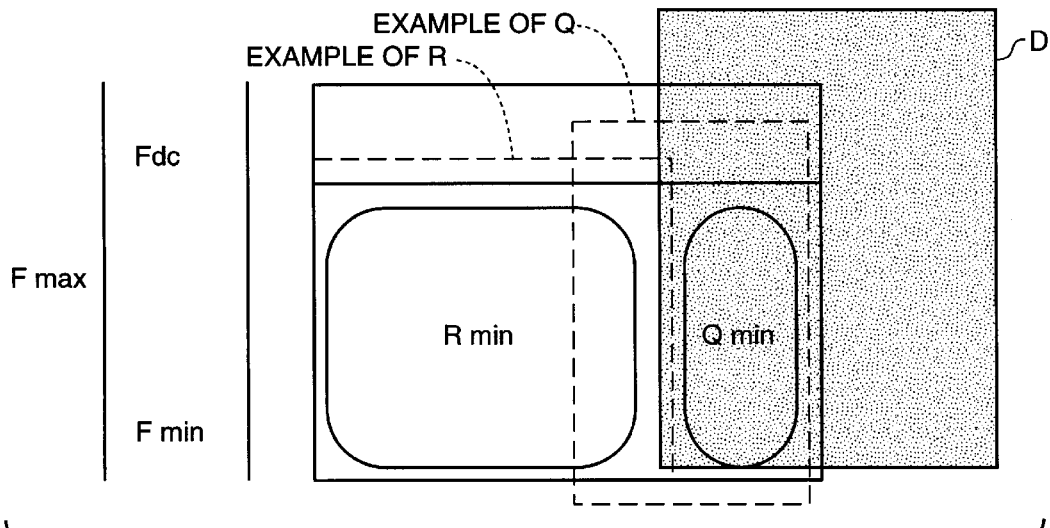
FIG._7

| Benchmark | MIS | CAT | COM | COM VS MIS (%) | COM VS CAT (%) |
|---|---|---|---|---|---|
| rd53 | 70 | 68 | 60 | -14.3 | -11.8 |
| misex1 | 86 | 88 | 75 | -12.8 | -14.8 |
| misex2 | 164 | 163 | 117 | -28.7 | -28.2 |
| f5lm | 168 | 174 | 167 | -0.6 | -4.0 |
| 5xpl | 164 | 159 | 148 | -9.8 | -6.9 |
| z4ml | 69 | 67 | 56 | -18.8 | -16.4 |
| sao2 | 183 | 174 | 201 | 9.8 | 15.5 |
| 9sym | 258 | 116 | 139 | -46.1 | 19.8 |
| vg2 | 246 | 254 | 133 | -45.9 | -47.6 |
| rd73 | 192 | 173 | 178 | -7.3 | 2.9 |
| bw | 299 | 306 | 223 | -25.4 | -27.1 |
| 9symml | 277 | 278 | 127 | -54.2 | -54.3 |
| alupla | 205 | 182 | 176 | -14.1 | -3.3 |
| duke2 | 772 | 736 | 528 | -31.6 | -28.3 |
| misex3 | 1053 | 1010 | 1342 | 27.4 | 32.9 |
| rd84 | 381 | 319 | 149 | -60.9 | -53.3 |
| Sum Average | 4587 | 4267 | 3819 | -16.7 | -10.5 |

FIG._8

AUTOMATIC SYNTHESIS OF INTEGRATED CIRCUITS EMPLOYING BOOLEAN DECOMPOSITION

FIELD OF THE INVENTION

This invention relates to the automatic synthesis of integrated circuits, particularly very large scale integrated circuits, with the aid of a programmed machine, usually called a compiler, by means of which an operator initially specifies a complex digital processing function, in an appropriate high level programming language, and obtains a detailed instruction, or netlist, for the layout of a very large scale integrated circuit which implements, in a selected technical realisation (such as CMOS ciruitry) the complex processing function which has been specified by the operator.

BACKGROUND OF THE INVENTION

The design, checking and testing of such integrated circuits is so complex that the use of automatic synthesis with the aid of a programmed machine is essential for the task. This is partly because the digital signal processing functions are inherently complicated, partly because the main data processing functions need to be decomposed into simpler functions which are within the 'library' of circuits to which the compiler has access and partly because substantial computation is required in order to achieve an efficient layout of the network.

In general, the circuit may be a combinatorial circuit or a sequential circuit, having a combinatorial part, with no memory or delay element, and a sequential part, constituted by memory or delay elements external to the combinatorial part, and based on, for example, a Mealy finite state machine or a Moore finite state machine, according to the preference of the designer.

It may be appreciated that the process of automatic logic synthesis typically commences with an original functional statement of the circuit or processor which is to be synthesized. This stage is followed by the stages of minimization, factorization and mapping. The last mentioned stage is a synthesis in terms of the basic circuits or cells which are maintained for access in the cell library. Before this stage is implemented the circuit or processor is expressed, so far as its combinatorial part is concerned, in terms of logic, such as Boolean equations, in a manner which is independent of technology.

An original functional statement in terms of Boolean logic equations is normally very complex and is far from optimal in terms of area or delay. Considerable attention has therefore been devoted in recent years to the development of algorithms for the minimization and decomposition of logical expressions into multilevel logic which can more efficiently express the desired functionality of the circuit or processor which is being designed. The final quality of the processor may be measured in terms of area, delay or a compromise of these measures.

Minimization simplifies logic equations by finding an equivalent representation, normally at a lower cost in terms of number of product terms and literals. Decomposition deals with the problem of finding components of Boolean equations that can be implemented once but used as often as required. Technology mapping determines how available logic cells, held within the library, will be used to implement decomposed equations.

One example of a decomposition process, specifically for the purpose of achieving positional ordering of inputs to the integrated circuit, is disclosed in U.S. Pat. No. 5,359,537, issued 25 Oct. 1994 to Gabriele Saucier and Franck J. Poirot, and assigned to the assignee of the present invention. The terminology, such as variable, literal, product term, kernel etc used in the present application conforms to that in the aforesaid patent, which is incorporated herein by reference.

SUMMARY OF THE PRIOR ART

The following references, identified by a short title preceding a respective full title, illustrate the current state of the art and are incorporated herein by reference:

| | |
|---|---|
| {BRA87} | R. K. Brayton and al., "MIS: a Multi-Level Logic Optimization System", IEEE Transaction on CAD, pp. 1062–1081, November 1987. |
| {BRY86} | R. E. Bryant, "Graph-Based Algorithms for Boolean Function Manipulation", IEEE Trans. on Computers, Vol. C-35, No. 8, 1986, pp. 677–691. |
| {COU92} | O. Coudert, J. C. Madre, "Implicit and Incremental Computation of Prime and Essential Prime Implicants of Boolean Functions", 29th ACM/IEEE Design Automation Conference 1992. |
| {COU93} | O. Coudert, J. C. Madre, H. Fraisse, "A New Viewpoint on Two-Level Minimization", 30th ACM/IEEE Design Automation Conference 1993. |
| {MIN93} | S. Minato, "Zero-Suppressed BDDs for Set Manipulation in Combinational Problems", 30th ACM/IEEE Design Automation Conference 1993. |
| {STA94} | T. Stanion and C. Sechen, "Boolean Division and Factorization using BDDs", IEEE Transactions on CAD, Vol. 13, No. 9, September 1994, pp. 1179–1184. |

Explanation of the Relevant State of the Art

Various methods are known for implementing combinatorial logic in key level form using programmable logic arrays. Standard methods of implementation were developed by Brayton {BRA87} above, wherein there is described a global optimization process which includes a variety of algorithms for the minimization, decomposition and timing optimization of multilevel logic functions.

The data structure for which all algorithms were developed with a direct mapping and was called sum-of-product representation of Boolean functions. The main advantage of such a structure is that all synthesis algorithms can be efficiently implemented with a sum-of-products structure. A drawback is that this structure uses too much memory even for sparse functions. Moreover, the execution time of the programme incorporating algorithms constructed on this basis increases exponentially for some Boolean operations such as comparison, proof and disjunction. The structure therefore becomes more and more inefficient as it is applied for the synthesis of larger networks.

Bryant, in {BRY86} introduced binary decision diagrams (BDD) which were later successfully used in formal verification, testing and simulation of combinatorial networks. Binary decision diagrams have been extended to a new sub-family called zero-suppressed binary decision diagrams by Minato, as described in {MIN93}. Minato introduced a method of factorization based on zero-suppressed BDD structures but the method is limited to algebraic techniques with a trivial decomposition flow. This flow only considers one function at a time and only one level kernel can be extracted based on the occurrence of the literals of the function. This means that there is no selection of the best kernel in a set and there is no weighting computation to extract the best kernel.

Stanion and Sechen in {STA94} discuss divisor extraction based on a path which is neither prime nor irredundant so that the gating is not correlated with the number of literals.

The division is based on cofactors which is a limited way to address Boolean division. Moreover, the algorithm considered by Stanion et al. is restricted to single functions.

Objects of the Invention

The present invention is the development in the synthesis and application of large scale integrated circuits of new Boolean optimization algorithms based on binary decision diagrams to provide better results in terms of literals, and thereby to improve the speed and minimizing area of the synthesized integrated circuit. Another object is to facilitate the handling of larger Boolean networks. A further object is to speed up the Boolean optimization phases, that is to say minimization and factorization.

The present invention is based on more efficient algebraic techniques than hitherto, a new form of Boolean division in order to take into account 'don't care' space during factorization and the joint use of both algebraic and Boolean techniques.

It is a more specific object of the invention to provide new level-zero kernel extraction algorithms based on zero-suppressed binary division diagrams, new algorithms for the extraction of intersecting kernels and common cubes in order to deal with the entire Boolean network; new Boolean division optimizing both dividend and remainder by considering 'don't care' space of the divided function, computation of exact divisory rates for each function with both algebraic and Boolean divisions, a compatability algorithm for the extraction of a set of kernels which do not affect the same cubes of the functions; and a new method for adding dynamically variables in binary decision diagrams and zero-suppressed binary decision diagrams.

The significance of these objects and the manner in which they may be achieved will become clearer by a consideration of the following specific description.

BRIEF DESCRIPTION OF THE DRAWINGS

FIG. 1 illustrates a binary decision diagram;

FIG. 2 illustrates a reduced order binary decision diagram;

FIG. 3 illustrates a further reduced order binary decision diagram;

FIGS. 4A and 4B illustrate the swapping of variables between decision graphs;

FIG. 5 illustrates irredundant prime cover generation;

FIG. 6 is a flow graph illustrating the process of decomposition;

FIG. 7 illustrates a method of Boolean division; and

FIG. 8 is a table of comparative results.

FIG. 9 is a schematic summary of the method to which the invention is applicable.

DESCRIPTION OF THE PREFERRED IMPLEMENTATION

Preliminary

The present invention is intended to form part of a method of automatic synthesis of a very large scale integrated circuit which comprises the following steps, which are summarised in FIG. 9:

(A) The circuit is specified in some high level language by the designer.

(B) The high-level representation is loaded into a programmed computer which converts the representation of the circuit into Boolean form if the circuit is wholly combinatorial. If the circuit is sequential, i.e. contains delay or memory elements, it may be represented using the architecture of a Moore machine or a Mealy machine, each of which has a combinatorial part and sequential elements such as delays or memory elements, external to the combinatorial part. The combinatorial part is represented in Boolean form.

(C) The complex Boolean expression, composed of at least one Boolean function and usually a multiplicity of Boolean functions, representing the combinatorial circuit or the combinatorial part of the circuit is factorized and may be subjected to other operations such as minimization.

(D) The resultant Boolean expression (together with functional expressions of any sequential elements) is mapped into a representation of the circuit in hardware terms by means of a cell library which enables each of the segments of the resultant expression to be replaced by a specification of a hardware circuit which will perform the function of that segment.

(E) The 'hardware' representation may be optimized.

The result of these steps, performed after step (A) by the programmed computer, is a set of instructions which determine a layout of the circuit. These instructions can be in or be converted to a form suitable for controlling a fabrication process.

Those skilled in the art will understand that all the foregoing steps (A) to (E) are part of the state of the art. They are for example described in U.S. Pat. No. 5,247,668 issued 21 Sep. 1993 to Smith et al., U.S. Pat. No. 5,282,148 issued 25 Jan. 1994 to Poirot et al., U.S. Pat. No. 5,359,537 issued 25 Oct. 1994 to Saucier et al., and pending applications Ser. No. 08/040,738 filed 31 Mar. 1993, Ser. No. 08/285,702 filed 24 Jun. 1994, Ser. No. 07/745,038 filed 14 Aug. 1991, Ser. No. 07/577,947 filed 5 Sep. 1990, and Ser. No. 07/991,995 filed 17 Dec. 1992, all assigned to the assignee of this invention; the teachings of all the foregoing are incorporated herein by reference.

The particular improvement with which the present invention is concerned is the factorizing step (C), and in practical terms improves the respective part of the programmed compilation of the circuit. The steps before and after the factorizing step do not form the essence of the invention and therefore will not be described at the inordinate length that might otherwise be necessary. The preliminary stages of providing a Boolean function defining the integrated circuit in a manner independent of the technological expression and the post-factorization stages of making the integrated circuit in accordance with the factorized expression may follow existing techniques.

1. Introduction

The generalization of hardware description languages such as VHDL or Verilog and improvements in the technologies allow the designer to consider the possibility of defining bigger designs. Also, to make these descriptions more readable and easily debuggable or back-annotated, designers generally introduce local variables or signals to express their logic functions. These descriptions yield huge redundant and unoptimized Boolean networks which in general cannot be processed using known optimization algorithms.

To reduce these limitations, binary decision diagrams (BDDs) have been introduced. BDDs are dense representations of Boolean functions based on Shannon decomposition. If a fixed input order for the successive Shannon decompositions is imposed, they become a canonical representation, known as reduced order binary decision diagrams (ROBDDs) which can be used for verification purpose and for direct technology mapping.

2. Definitions
2.1. Binary Decision Diagrams

Given a Boolean function $F(x_1,x_2,\ldots,x_n)$ the positive and negative cofactors of f with respect to x are defined by $F_x=F(1,x_2,\ldots,x_n)$ and $\overline{F}_x=F(0,x_2,\ldots,X_n)$. The Shannon expansion with respect to variable x is given by $F=x.F_x+\overline{x}.F_x$. A binary decision diagram is a directed acyclic graph (DAG) in which every node represents a Boolean function. The construction of a BDD is based on the successive Shannon decompositions of the function according to a splitting variable as shown in FIG. 1. This Figure represents the Boolean function F=ab+cd. Each non-terminal node n rooted by a variable x corresponds to a function F(n) and is the origin of two arcs $F(n)_0$ and $F(n)_1$. The graph rooted at $F(n)_0$ represents the negative cofactor $F(n)_{\overline{x}}$ and is called the Else-Edge of n. The graph rooted at $F(n)_1$ represents the positive cofactor $F(n)_x$ and is called the then-edge of n.

For an ordered binary decision diagram (OBDD) a total ordering '<' over the set of variables is imposed. On any path from a root to a terminal node the variables occur in the given order. The graph may have redundant vertices and duplicated subgraphs. They can be eliminated by repeatedly applying known transformation rules. The BDD shown in FIG. 1 is in fact an OBDD with the order a<b<c<d.

The maximally reduced graph is called a reduced ordered BDD (ROBDD). For a given Boolean function and a given ordering, this graph is unique and therefore constitutes a canonical representation. This property presents crucial advantages for functional equivalence testing.

FIG. 2 shows the ROBDD of F=a xor b xor c.

A ROBDD with negative edge is a more compact representation. In this representation, not only are common subtrees corresponding to the classical notion of subfunctions (SF) identified, but the complemented subtrees (SF) are also detected. The subtree and its complement will be represented only once and a negative edge can be considered as an inverter. FIG. 3 shows the ROBDD with negative edges of F=a xor b xor c. In what follows the term BDD' is used for convenience to denote a ROBDD with negative edges.

2.2. Dynamic Improvement of the Ordering

After each removal of unwanted data, the variable ordering may be dynamically improved by a procedure which is illustrated in FIGS. 4A and 4B. This step reduces the current node count, and makes the future operations faster to perform. It also allows the building of BDDs which could not be built with any fixed ordering because any given ordering would fail during one of the steps of the construction. The procedure comprises a swapping of variables. The swapping can be performed on adjacent variables $v_i$ and $v_{i+1}$. This allows change to be confined to the part of the DAG containing $v_i$ and $v_{i+1}$, instead of requiring re-building of the whole graph.

FIGS. 4A and 4B give the general case of the method when $F_0$ and $F_1$ occur more than once. FIG. 4A represents an ordered binary decision diagram having a first part 41, containing the variables $v_1$ to $v_{i-1}$, a second part 42 consisting of two adjacent variables $V_i$ and $v_{i+1}$ and a third part 43 containing the variables $V_{i-2}$ to $v_n$. It is feasible to change the order of the variables $v_i$ and $v_{i+1}$, as shown in FIG. 4B. Note that newly built nodes have to be made canonical and be looked up in a node hash table before they are physically created. The interesting property of an adjacent swapping is that the top and bottom parts 41 and 43 of the DAG, built from $v_i$ to $v_{i+1}$ and from $v_{i+2}$ to $v_n$ respectively are unchanged before and after the transformation. Considering F, F0, F1 as inputs, the top part 41 of the DAG denotes the same BDDs with the same input ordering, before and after the swapping, shown in FIG. 4A and FIG. 4B respectively. Thus, the canonicity property of BDDs requires that the DAG obtained after swapping $v_i$ and $v_{i+1}$ is homomorphic to the initial one. Now considering $F_{ij}$ $(i,j) \in \{0,1\}$, as outputs, the bottom part of the DAG denotes the same BDDs with the same ordering before and after swapping.

2.3. Cube Set Manipulation

Logic operations like intersection and union can be easily performed on ZBDDs. These operations are thousands of times faster than those based on sum-of-products, and deal with much larger networks. Table 1 shows one procedure which performs the union of two ZBDDs.

TABLE 1

```
zbddNode procedure unionZBDD(f,g)
{   if f=emptySet then return(g)
    else if g=emptySet then return(f)
    else if f=baseSet or g=baseSet then return(baseSet)
    else if f=g then return(f);
    orderF := get ZBDDorder(f);
    orderG := get ZBDDorder(g);
    if orderF < orderG then
        result := getZBDD(f.ifEdege,unionZBDD
            (f.elseEdge,g),f.ifEdge)
    else if orderF > orderG then
        result := getZBDD(g.ifEdege,unionZBDD
            (f,g.elseEdege),g.ifEdge)
    else result := getZBDD(f.ifEdege,unionZBDD
        (f.elseEdege,g.elseEdege),
            unionZBDD(f.ifEdge,g.ifEdge));
    return(result);
}
```

One may also need to build the BDD of a cube set denoted by a ZBDD. For this purpose a recursive algorithm described for example in Table 2 may be used.

TABLE 2

```
procedure ZBDDtoBDD(zbdd)
{   if zbdd=emptySet then return(emptySet);
    if zbdd=baseSet then return(baseSet);
    T := ZBDDtoBDD(zbdd.then)
    E := ZBDDtoBDD(zbdd.else)
    V := ZBDDtoBDD(zbdd.var)
    return((V and T) or E);
}
```

2.4. Implicit Minimization

In conjunction with BDDs which lead to a more efficient representation of Boolean functions than logic trees, an efficient cube set representation is necessary to perform the minimization process. This process, previously called Sum-Of-Product structure, appears to be very greedy in memory usage and unsuitable for logic operations like inverting or equivalence testing. Madre and Coudert {COU92} have proposed a BDD based meta-product structure, which requires two variables $(o_i,s_i)$ to denote the occurrence and the sign of each input $x_i$. In such a BDD, each 1-path starting from the root node denotes a cube. The paths rooted by the Then-Edge of $o_i$ contains an occurrence of $x_i$. Then, $s_i$ expressed if $x_i$ occurs in its direct (Then-Edge) or complemented form (Else-Edge). This structure has the advantages of compactness and canonicity for prime sets, and its size is not related to the number of cubes it denotes.

In {COU92} was proposed a method of computing primes of large functions that had never been handled before, and {COU93} provided a new logic minimization algorithm. Nevertheless, for sparse networks like some ISCAS benchmarks the meta-products structure could become excessively large, even if the BDDs of these networks can be built. As previously mentioned, Minato proposed in {MIN93} a new cube set structure called Zero-Suppressed BDDs based on new reduction rules on BDDs. This structure is more suitable for cube set manipulation than meta-products, especially for sparse networks. In this structure, one variable is used to denote in which cube an input $x_i$ appears, and an other variable denote in which cube $x_i$ appears. The major improvement consists of a new reduction rule which eliminates from the graph the variables which do not appear in the cubes to whose path they belong, namely the variables whose Then-Edge points to the '0' terminal node. FIG. 5 and Table 3 give the algorithm described with meta-products in {COU92}, adapted here with ZBDDs.

TABLE 3

Irr (F,Fsup)
    if F-emptySet then return (emptySet)
    if Fsup=baseSet then return (baseSet)
    $S_x := Irr (F_x.\{\overline{Fsup}\}_{\bar{x}}, \{Fsup\}_x)$
    $S_{-x} := Irr (F_{\bar{x}}.\{\overline{Fsup}\}_{\bar{x}}, \{Fsup\}_{\bar{x}})$
    $Sd := Irr (F_{\bar{x}}.\{S_x\}+F_x.\{S_{\bar{x}}\},$
        $\{Fsup\}_{\bar{x}}.\{Fsup\}_x)$
    return ( )

FIG. 5 expresses the transformation of a Boolean function into a zero-suppressed BDD. It works recursively, considering each variable of the said function following an input ordering determined in a previous process. From this Figure, similar to a Karnaugh map, one can determine three sets for a variable "x":

$S\bar{x}$: set of functions where $\bar{x}$ appears,

Sx: set of functions where x appears,

Sd: set of functions where neither x nor $\bar{x}$ appears.

The function F is the union of the three squares, and the algorithm would provide the optimized solution for the three sets. For instance, the set $S\bar{x}$ should cover at least the area in the $\bar{x}$ part which does not intersect with $\bar{x}.F\bar{x}$ (the 'minimal' section), and the maximum may cover the union of the previous set and $\bar{x}.F\bar{x}$. The optimized solution for S $\bar{x}$ will be between the minimum and the maximum as shown on the Figure by the shaded part.

3. Boolean Network Decomposition 3.1. State of the Art

The decomposition of a Boolean network is of prime importance in logic synthesis because it directly impacts on the quality of the synthesized circuit. Even if the quality criteria is measured in terms of area, speed, power of testability, it has been proved that the count of literals is a good predictor. It is part of the technology mapping process which takes into account the criteria fixed by the designer to provide a circuit matching the given goals or achieving an acceptable compromise. Technology mapping can only produce an optimal result for a given decomposed network. This means that decomposition directly impacts on the technology mapping task.

Algebraic methods to optimize combinatorial circuitry were proposed in the early 1950's. These methods were only suitable for small networks not exceeding ten variables. They were strongly enhanced in the 1980's by more sophisticated methods.

Nevertheless, earlier work was mainly targeted on programmable logic arrays. Clearly, the sum-of-product representation was very attractive to deal with Boolean networks, because the programming data structure was compact, and the algorithms used the efficiency of the classical programming languages. Therefore, most designs of that period were handled in an efficient way.

The introduction and the generalization of hardware languages such as Verilog, VHDL, and the improvements in the technologies implied a significant increase of the size of Boolean networks. Then, industrial applications became more and more impractical for use with standard sum-of-product approaches. They usually consume huge memory space and take large computing time. Of course, numerous heuristics reduced these weaknesses but they seriously impacted on the quality of the final circuitry.

The introduction of implicit techniques enables a reconsideration and enables known techniques to be considerably extended.

The method which is the subject of the present invention takes advantage of the efficiency of the new BDD and ZBDD package. One aim is to develop implicit techniques allowing the user to consider a complete Boolean network as input to an optimizer. Then, one may run sophisticated decomposition techniques (divisor extraction, exact weighting, Boolean or algebraic division) on industrial networks with fast execution time.

3.2. Decomposition Flow

A typical decomposition process is shown in FIG. 6. The first phase consists of computing a set of candidates which can be used to divide one or more functions in the Boolean network. Obviously, if no candidate is found the decomposition is ended. Afterwards, at least one or more candidates must be selected as divisor and it is important to define an accurate selecting criterion which correctly represents the goal of the optimization. In a technology independent optimization a suitable criterion is the number of literals in a Boolean function. Then, for each candidate one computes a weight which represents exactly the number of literals saved in the Boolean network when this candidate is used as divisor. Preferably all the functions in the Boolean expression are divided by each candidate and the respective complement thereof to obtain the 'weight' of attributed 'value' of each candidate. Moreover, in order to have a more powerful decomposition, one may use a method for determining the best compatible set of candidates. This allows the division of the Boolean network by several candidates in the same iteration instead of using only one. To divide the Boolean network one may use both Boolean and algebraic divisions based on ZBDD structure. The power of these two new divisions allows both to be run for each candidate and the retention of the best result without a large cpu time penalty. Specific examples of the algorithms used in a method according to the invention are described more precisely in the following paragraphs.

3.3. Divisor Extraction

The most popular method for the identification of common sub-expressions in the Boolean network involves the use of kernels. As is explained in Saucier et al. above cited and elsewhere, a kernel K of a function F is defined as the cube free quotient of F by a cube C, a 'cube' being a conjunction of literals, whereby 'ab' is a cube but 'aa' is not.

The new method exploits the implicit structure to obtain all level-0 kernels of a function. One main advantage of this procedure with respect of classical sum-of-products is that during examination of the implicit structure graph only effective inputs are considered inputs; thus a set of level-0 kernels can be generated in a short computational time. The pseudo code of a level-0 kernel extraction procedure is given in Table 4 below.

TABLE 4

```
kernel0(zbdd),lit)
{   if nbLiterals(zbdd) < 2 then return
    while (lit:=nextInput(zbdd,lit))
    {   if not literalsSeveralTimes(zbdd,lit) then continue;
        zbddVar := getZBDDVar(lit);
        zbdd1 := subSetWhenVarIs1 (zbdd,zbddVar);
        cubeFactor:=largestCubeFactor(zbdd1,zbddVar);
        if cubeFactor=emptySet then continue;
        if cubeFactor<>baseSet then zbdd1 := divideAlgZBDD
             (zbdd1,cubeFactor);
        updateCandidatList(zbdd1);
        kernel0(zbdd1,lit);
    }
}
```

Using only level-0 kernel candidates is not enough to provide an efficient decomposition because some other candidates such as intersecting level-0 kernels or common cubes may be good divisors. Intersecting level-0 kernels can be computed from the level-0 kernel set generated with the procedure previously described. For instance, if the two level-0 kernels K1=a+b+c and K2=a+b+d are found, the intersectKernel procedure described below will find the candidate represented by the intersecting kernel a+b, which will be put in the candidate list. In the same way, if in the Boolean network there are two sub-functions F and G such as F=a.b.c.d+e.f.g and G=a.b.c.e+f.g.h, we can easily see that the cubes a.b.c and f.g are shared by F and G. The procedure commonCube for extracting common cubes in the Boolean network is described below.

Therefore, the new candidate computation phase based on ZBDD generates a list of candidates containing level-0 kernels, intersecting kernels and common cubes and allows the choice of the best candidate among a large set of candidates.

TABLE 5

```
kernelIntersect()
{   for i:=1 to (nbKernel0-1)
    {   for j:=(i+1) to nbKernel0
        {   newKernel:=intersection(kerneli,kernelj)
            if newKernel<>emptySet then updateIntersectList
                (newKernel);
        }
    }
}
commonCube(f,g,cube,lit)
{   if(f=baseSet OR g=baseSet) AND nbLit(cube)>1 then
         updateCubeList(cube)
    while (lit:=nextInput(f,lit))
    {   zbddLit:=getZBDDVar(lit);
        if nbLit(g)=1 then
            if g=zbddLit then zbddVarG:=baseSet else
                zbddVar:G+emptySet
        else zbddVarG:=subSetWhenVarIs1(g,zbddLit);
        if zbddVarG=emptySet then continue;
        if nbLit(f)=1 then
            if f=zbddLit then zbddVarF:=baseSet else
                zbddVarF:=emptySet
        else zbddVarF:=subSetwhenVarIs1(f,zbddLit);
        commonCube(zbddVarF,zbddVarG,zbddMultiply
                (cube,zbddLit),lit);
    }
}
commonCubesExtract( )
{   for all funci and funcj
    commonCube(funci,funcj,baseSet,0);
}
```

3.4. Divisor Selection

After obtaining a set of candidates for decomposition, the weight or attributed value of each of them should be computed. This value or weight may be the number of literals saved in the Boolean function when the function is divided by this candidate. During the weight computing phase, all functions in the Boolean function may be divided by the candidate and its complement by means of both algebraic and Boolean division. Obviously, the weight of a candidate may be the sum of the best weights obtained for each divided function.

Afterwards, one needs to select the best candidate and divide the Boolean network by it. In fact, in order to have a powerful decomposition in terms of quality and cpu time, it is appropriate to select a set composed of a multiplicity of candidates instead of using only one candidate at each iteration. To select a set of candidates by keeping the correct knowledge of the saving of literals, one may introduce the term of compatibility between candidates. Then, two candidates $c_1$ and $c_2$ are compatible if and only if the entire Boolean network can be divided in the same way by $\{c_1,c_2\}$ and $\{c_2,c_1\}$. In other words, $c_1$ and $c_2$ are compatible if the parts of Boolean functions affected are disjointed; this means that the weight of $c_2(c_1)$ computed before and after dividing the Boolean network by $c_1(c_2)$ is the same.

Then, after computing all compatibilities one may build a compatibility graph and use an algorithm to find the best weighted clique which represents a set of compatible candidates.

3.5. Boolean Division

The problem of Boolean division is complex because it requires the computation of Boolean operations which may have a high complexity under some data structures. Known methods such as MIS {BRA87} solve this problem by expressing the divisor as the 'don't care' of its expression by its variable. Such a method has the disadvantage of requiring the computation of the complement of a divisor; this is of an exponential complexity with sum-of-product structures instead of being immediate with BDDs. Therefore, methods using sum-of-products have to include a bunch of heuristics to handle large designs and the results which badly suffer in quality. Additionally, most industrial design tools make only use of algebraic techniques. Even with the BDD structure the problem is not easy to solve since Boolean division creates a large number of nodes in the BDD structure which may easily blow up the system if no memory control is performed.

In accordance with the invention Boolean division is performed using a novel method which uses the principle of the implicit minimizer and computes the best bounds of the remainder (R) and the dividend. First the smallest remainder is computed with smallest lower bounds (Rmin) and largest upper bounds (Rmax) to increase the Boolean space. Afterwards, bounds for the quotient are computed by taking into account the results obtained for the remainder. FIG. 7 and Table 6 show the principle of the implicit Boolean division, where F is the dividend, i.e. the function to be divided, D is the divisor, Q is the quotient and R is the remainder:

TABLE 6

$$F = D \cdot Q + R$$
$$0 < \overline{Q < D + F}\text{max}; \text{Fmin.} (\overline{Q} \cdot \overline{D}) < R < F\text{max}$$
$$R\text{min} = F\text{min.} \overline{D}; R\text{max} = F\text{max} \dashrightarrow R$$
$$Q\text{min} = F\text{min.} \overline{R}; Q\text{max} = F\text{max} + \overline{D} \dashrightarrow Q$$

This process assumes that the function F and the divisor D are known and that the quotient Q and the remainder R should be minimal, i.e. have fewest numbers of literals and product terms.

Note that during execution of these operations, dynamic ordering and garbage collection (removal of unwanted data) may be used in order to avoid the excessive use of memory by the creation of internal BDD nodes.

Table 7 illustrates a simple example of the division of a function F=(a+b.c) by a divisor D=(a+c). As will be seen, the method yields a remainder R of zero, which is then used in the computation of Q.

TABLE 7

$F = a + b \cdot c$
$D = a + c$
$Rmin = Fmin \cdot \bar{D} = (a + b \cdot c) \cdot \bar{a} \cdot \bar{c} = 0$
$Rmax = Fmax = a + b \cdot c$
$\Rightarrow R = 0$
$Qmin = Fmin \cdot \bar{R} = a + b \cdot c$
$Qmax = Fmax + \bar{D} = a + b \cdot c + \bar{a} \cdot \bar{c} = a + b + \bar{c}$
$Q = a + b$
$F = (a + c) \cdot (a + b) + 0$ 4. Unified Approach with Verification It is desirable to detect as soon as possible any errors in the final implementation. For that purpose, formal verification techniques have been widely developed and adopted.

Errors can be either introduced by the system itself or by the designer, who may have modified the schematic to respect a specific constraint. So, both aspects should be considered to provide a convenient system which guarantees the correctness of the design without too much CPU overhead.

The described method may use the same data structure with its canonicity property to optimize the network and to verify if the final implementation is correct regarding the initial functional description, and thereby there need be no additional overhead in the computation time used for verification.

In case of errors, a report may indicate which signal is incorrect and the designer can easily back-annotate the functional description. Also, the method can be used as a prover. In that case, the designer specifies properties (for instance a traffic light is not green and red at the same time). These properties may be converted in the data representation, and be compared with in the specification. The designer has thereby a powerful way of checking that his high-level description respects his specification.

5. Experimental Results

A program incorporating a Boolean optimization algorithm according to the invention was implemented as part of the ASIC Synthesizer of Compass Design Automation. This program was written on Mainsail (see the MAINSAIL language manual, Xidak Inc., 1987) on SPARC 1030. It was tested on standard MCNC benchmarks and compared with the factoring results of MIS from Berkeley, and CATAMOUNT from the University of Washington. The first one uses classical sum of product representations, and the latest new Boolean techniques applied on BDDs as previously described. The saving of literals is used as a criterion for the comparison. It has also the interest of being independent of the mapping process and the target library, and so fair comparisons can be drawn.

Results are shown in FIG. 8. The first column gives the name of the benchmarks provided by MCNC. The two others give information on the I/O connection numbers. The MIS column provides results given in {BRA87}, and the CAT (for CATAMOUNT) were given in {STA94}. COM gives the results for Compass. The ratio for MIS and CAT is computed as the difference of literals with COM divided by MIS and CAT respectively. It shows an average improvement of 16.7% in terms of literals compared with MIS, and 10.5% compared with CAT.

6. Conclusion

The present invention provides new multilevel synthesis techniques based on binary decision diagrams and implicit cube manipulation. These techniques can be advantageously applied to industrial designs due to the efficiency of dynamic approach to building and applying the BDD core algorithm. This BDD core can control the memory usage to prevent any explosion and also to speed up the complete process which is a novel and powerful approach allowing the synthesis and optimization of larger designs.

Both cpu time and memory usage can still be improved by using several BDDs with different input orderings instead of using only one.

The foregoing is given by way of example only, it being understood that the invention is limited only by the spirit and/or scope of the claims that follow.

We claim:

1. In a method of automatic synthesis of an integrated circuit, comprising the steps, performed by a programmed machine, of storing a Boolean expression which expresses a combinatorial part of the said integrated circuit, factorizing the Boolean expression and mapping the factorized Boolean expression into a representation of said integrated circuit in hardware terms, the improvement wherein said step of factorizing comprises:

(a) computing a zero-suppressed binary decision diagram (ZBDD) unique to and representing the Boolean expression;

(b) computing, from said ZBDD, selected candidates divisors of said expression; and (c) decomposing said Boolean expression by implicit Boolean division of said expression by said selected candidate divisors, said decomposing comprising computing implicitly a quotient Q by (i) computing maximum and minimum bounds of a remainder R and (ii) computing maximum and minimum bounds of said quotient Q in accordance with said remainder, wherein said maximum and minimum bounds of said remainder R are computed respectively as the maximum bound of a function F and as the product of the minimum bound of the function F within said Boolean expression and the complement of at least one said candidate divisor and wherein said maximum and minimum bounds of said quotient are computed respectively as the product of the minimum bound of said function F and the complement of said remainder and as the sum of the maximum bound of said function and the complement of said remainder.

2. A method according to claim 1 wherein said step (b) including the substeps of:

computing an attributed value for each of a plurality of candidate divisors; and selecting at least of one said candidate divisors as a candidate having an optimum attributed value.

3. A method according to claim 2 wherein said Boolean expression comprises a multiplicity of Boolean functions and said step of computing an attributed value comprises computing said attributed value by dividing all said multiplicity of Boolean functions by each of said candidate divisors and the respective complement of each of said candidate divisors.

4. A method according to claim 2 wherein said attributed value of a respective candidate divisor is the number of literals saved in the Boolean expression when the expression is divided by said respective candidate divisor.

5. A method according to claim 1 wherein said step (b) comprises selecting a set composed of a multiplicity of compatible candidate divisors and said step (c) of dividing comprises dividing said Boolean expression by said candidate divisors in said set.

6. A method according to claim 1 wherein said step (b) of computing candidate divisors comprises extracting kernels of said expression.

7. A method according to claim 1 wherein said step (b) of computing candidate divisors comprises computing intersecting kernels of said expression.

8. A method according to claim 1 wherein said expression includes at least two distinct functions and said step of computing candidate divisors comprises extracting cubes common to said two distinct functions.

9. A method according to claim 1 wherein said step (c) of decomposing comprises for each of said selected candidate divisors computing an optimized quotient and an optimised remainder.

10. A method according to claim 1 further comprising verifying said circuit in accordance with said factorized Boolean expression.

* * * * *